United States Patent
Chen

(10) Patent No.: US 7,315,203 B2
(45) Date of Patent: Jan. 1, 2008

(54) D-CLASS AUDIO POWER AMPLIFIER AND METHOD THEREOF

(75) Inventor: Chuan-Chu Chen, Taoyuan (TW)

(73) Assignee: Benq Corporation, Taoyuan Shien (TW)

( * ) Notice: Subject to any disclaimer, the term of this patent is extended or adjusted under 35 U.S.C. 154(b) by 126 days.

(21) Appl. No.: 11/239,092

(22) Filed: Sep. 30, 2005

(65) Prior Publication Data

US 2006/0114058 A1 Jun. 1, 2006

(30) Foreign Application Priority Data

Oct. 5, 2004 (TW) ............................... 93130154 A

(51) Int. Cl.
*H03F 3/38* (2006.01)

(52) U.S. Cl. ..................... 330/10; 330/207 A

(58) Field of Classification Search .................. 330/10, 330/207 A, 251
See application file for complete search history.

(56) References Cited

U.S. PATENT DOCUMENTS 6,683,494 B2 * 1/2004 Stanley .......................... 330/10

FOREIGN PATENT DOCUMENTS

JP 2002-202440 7/2002

* cited by examiner

*Primary Examiner*—Robert Pascal
*Assistant Examiner*—Hieu Nguyen
(74) *Attorney, Agent, or Firm*—Rabin & Berdo, P.C.

(57) ABSTRACT

A D-class audio power amplifier including a microprocessor, a power amplifier, and a low pass filter is provided. The microprocessor is used to sample an input audio signal and output a pulse width modulation (PWM) clock signal. The power amplifier is used to amplify the power of the PWM clock signal and output a power-amplified signal. The low-pass filter is used to filter the high-frequency signal portion off the power-amplified signal and output an output audio signal. The method includes sampling the input audio signal to obtain a number of digital sampling values; obtaining corresponding duty cycles according to the digital sampling values and a reference voltage level and generating the PWM clock signal accordingly; power-amplifying the PWM clock signal to obtain the power-amplified signal; and filtering the high-frequency signal portion off the power-amplified signal to obtain the output audio signal.

13 Claims, 4 Drawing Sheets

| Sampling comparison value Vs | Duty cycle Dc |
|---|---|
| Vs1 | Dc1 |
| Vs2 | Dc2 |
| ⋮ | ⋮ |

D-CLASS AUDIO POWER AMPLIFIER AND METHOD THEREOF

This application claims the benefit of Taiwan application Serial No. 93130154, filed Oct. 5, 2004, the subject matter of which is incorporated herein by reference.

BACKGROUND OF THE INVENTION

1. Field of the Invention

The invention relates in general to a D-class audio power amplifier and method thereof, and more particularly to a D-class audio power amplifier driven by a micro-processor and method thereof.

2. Description of the Related Art

Compared with an A-class or a linear power amplifier, a D-class audio power amplifier has the features of low heat-radiation and low power-consumption and is often used in an LCD TV to power-amplify the input audio signal.

Referring to FIG. 1A, a circuit block diagram of a conventional D-class audio power amplifier is shown. A D-class audio power amplifier 100 includes a pulse-wave generator 110, a modulator 120, a power amplifier 130 and a low-pass filter 140. The pulse-wave generator 110 is used to generate a triangle wave WT. The modulator 120 is used to mix an input audio signal Sa with the triangle wave WT to be compared with a reference voltage Vf then outputs a pulse width modulation (PWM) signal SP. The power amplifier 130 power-amplifies the PWM signal to obtain a power-amplified signal, then the low-pass filter 140 filters the high-frequency signal portion off the power-amplified signal to output an amplified audio signal So. Moreover, the power amplifier 130, which is normally operated under single power and has a single input voltage Vcc, generates a higher operating voltage (VDD) via a charge pump (not shown in the diagram) to control the transistor switching operation of the control power amplifier 130.

Besides, the current requirement of the power consumption for the LCD TV under power-saving mode is almost under 1 Watt. Therefore, the display control circuit of the LCD TV normally adopts a Central Processor Unit (CPU), whose function is simple and power-consumption is low such as an integrated circuit with an 8051 processor, as a control circuit to awake the pixel-works when the LCD TV is under power-saving mode.

Referring to FIG. 1B, a circuit structural diagram of a power-saving system of an LCD TV according to prior arts is shown. The 8051 processor 150 is at idle state when the LCD TV is under normal operation. When the LCD TV is operating under power-saving mode, only the processor 150 is at operating state, while other parts such as a pixel-works 160 are all at power-off state. Meanwhile, the 8051 processor 150 can be controlled by an external signal S such as a remote control signal to switch on a switch 170 for the power of a power module 180 to be inputted into the pixel-works 160 to awake the entire system. The low power-consumption CPU is at idle state when the system is under normal system operation. The system manufacturing costs can be reduced if the CPU is wisely used to drive a D-class amplifier.

SUMMARY OF THE INVENTION

It is therefore the object of the invention to provide a D-class audio power amplifier and the method thereof. The invention uses a micro-processor with analog/digital conversion function to sample an input audio signal to generate a pulse width modulation (PWM) signal and power-amplify an audio signal in co-operation with a power amplifier and a low-pass filter, so as to effectively reduce system manufacturing costs.

According to an object of the invention, a D-class audio power amplifier for amplifying an input audio signal and outputting an output audio signal is provided. The D-class audio power amplifier includes a micro-processor, a power amplifier and a low-pass filter. The micro-processor is used to sample the input audio signal and output a PWM clock signal. The power amplifier is used to power-amplify the PWM clock signal and output a power-amplified signal. The low-pass filter is used to filter the high-frequency signal portion off the power-amplified signal and output an output audio signal. The micro-processor includes an analog/digital converter and an operation unit. The analog/digital converter is used to sample the input audio signal and output a number of digital sampling values. The calculating unit is used to obtain the corresponding duty cycles according to calculation of the digital sampling values and a reference voltage level and output the PWM clock signal accordingly.

The calculation unit obtains the corresponding duty cycles according to the absolute differences between the digital sampling values and the reference voltage level and determines the level of the PWM clock signal according to the comparison between the digital sampling values and the reference voltage level. The micro-processor pre-sets a parameter reference table via firmware. The parameter reference table includes a column of sampling comparison values and a column of corresponding duty cycles. The calculating unit calculates the absolute difference between each digital sampling value and the reference voltage level to obtain an appropriate corresponding duty cycle value with reference to the column of sampling comparison values in the parameter reference table.

The D-class audio power amplifier is used in an LCD device, and the micro-processor is a low power-consumption CPU operated as the LCD device is under power-saving mode. The power amplifier includes a first operating voltage and a second operating voltage. The first operating voltage and the second operating voltage are provided by system voltages of the LCD device. Therefore, the system manufacturing costs can be effectively reduced, by using the micro-processor to generate the PWM clock signal for power-amplifying the audio signal.

According to another object of the invention, a method for power amplifying a D-class audio signal is provided. The method includes sampling an input audio signal to obtain a number of digital sampling values; obtaining corresponding duty cycles according to the calculation of the digital sampling values and a reference voltage level and accordingly generating a PWM clock signal; power-amplifying the PWM clock signal to obtain a power-amplified signal; and filtering a high-frequency signal portion off the power-amplified signal to obtain an output audio signal. The method uses an analog/digital converter to sample the input audio signal. The step of generating the PWM clock signal includes obtaining corresponding duty cycles according to the absolute differences between the digital sampling values and the reference voltage level; and determining the level of the PWM clock signal according to the comparison between the digital sampling values and the reference voltage level.

The method pre-sets a parameter reference table via firmware. The parameter reference table includes a column of sampling comparison values and a column of corresponding duty cycles. The step of obtaining corresponding duty cycle values includes calculating the absolute differences between the digital sampling values and the reference voltage level and obtaining appropriate corresponding duty cycles with reference to sampling comparison values of the parameter reference table. Therefore, sampling the input audio signals and generating a PWM clock signal for power-amplifying the audio signals via firmware help to reduce system manufacturing costs.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
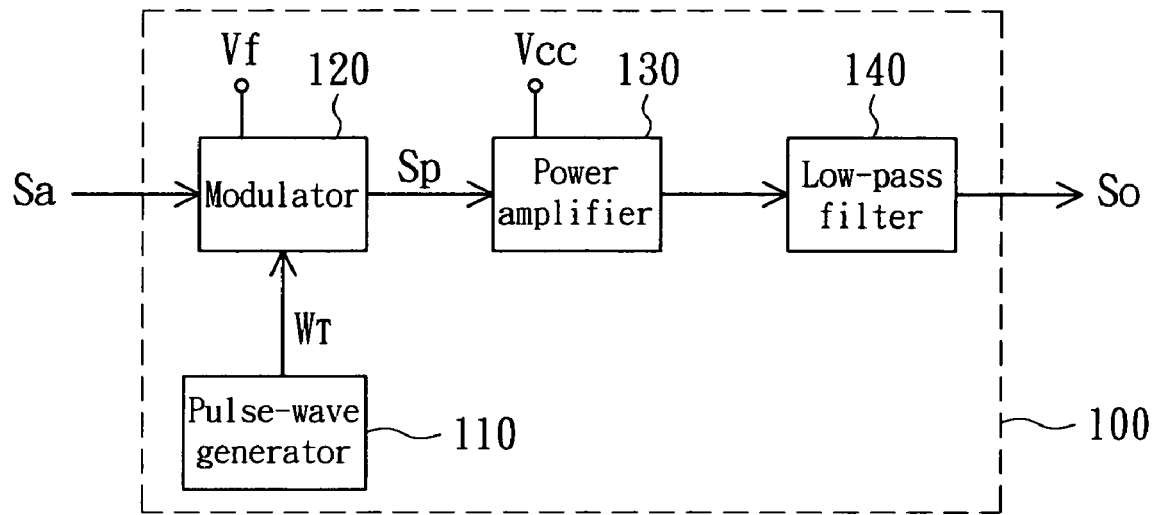
FIG. 1A is a circuit block diagram of a conventional D-class audio power amplifier.
Figure 1B:
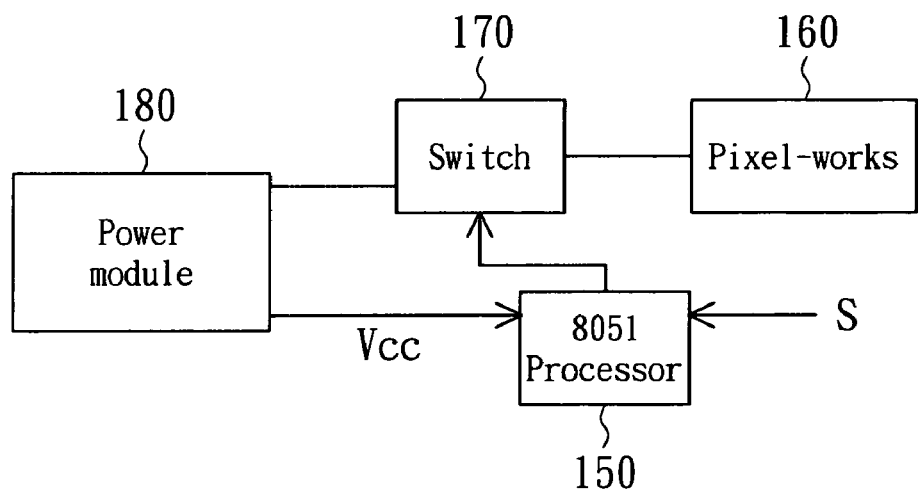
FIG. 1B is a circuit structural diagram of a power-saving system of an LCD TV according to prior arts.
Figure 2:
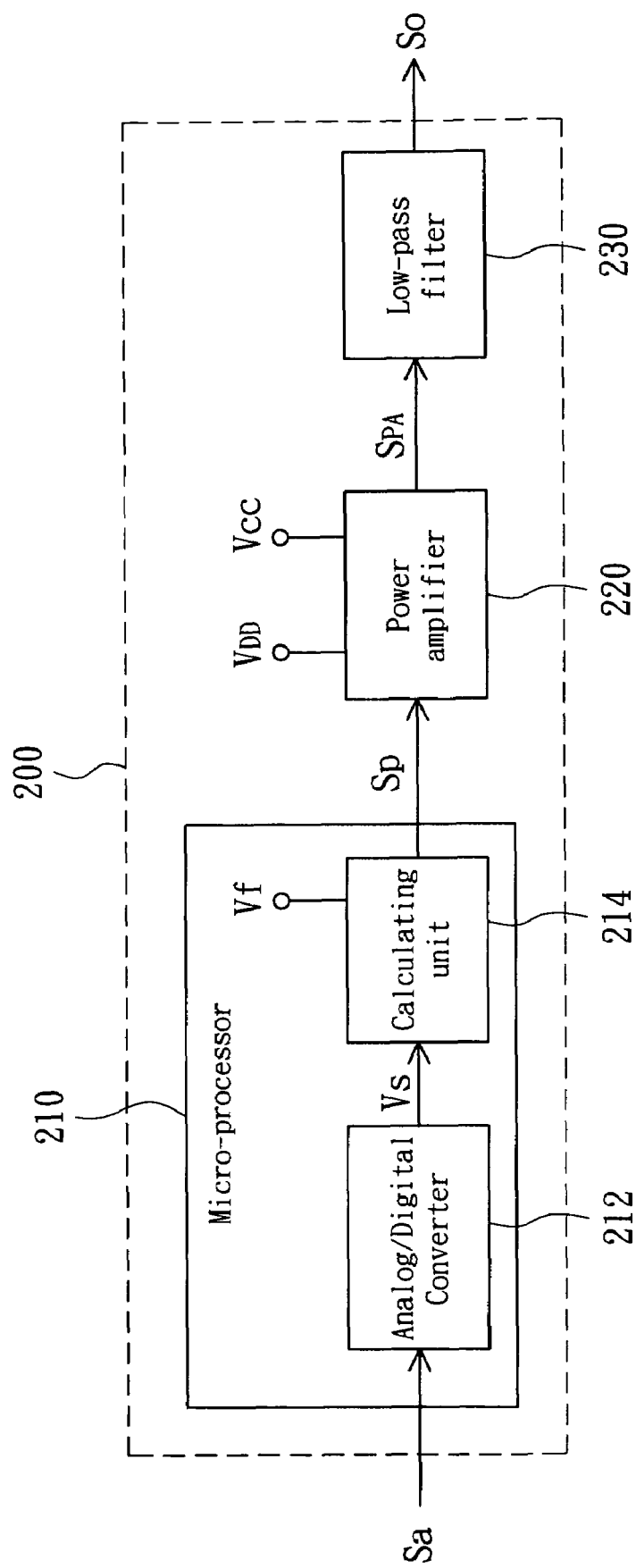
FIG. 2 is a circuit block diagram of a D-class audio power amplifier according to a preferred embodiment of the invention.

Referring to FIG. 2, a circuit block diagram of a D-class audio power amplifier according to a preferred embodiment of the invention is shown. A D-class audio power amplifier 200 is used to amplify an input audio signal Sa and output an output audio signal So. The D-class audio power amplifier 200 includes a micro-processor 210, a power amplifier 220 and a low-pass filter 230. The micro-processor 210 is used to sample the audio signal Sa and output a pulse width modulation (PWM) clock signal SP. The power amplifier 220 is used to power-amplify the PWM clock signal SP and output a power-amplified signal SPA. The low-pass filter 230 is used to filter the high-frequency signal portion off the power-amplified signal SPA and output the output audio signal So.

The micro-processor 210 includes an analog/digital converter 212 and an calculating unit 214. The analog/digital converter 212 is used to sample the input audio signal Sa and output a number of digital sampling values Vs. The calculating unit 214 is used to obtain the corresponding duty cycle according to calculation on the digital sampling value Vs and a reference voltage level Vf and accordingly output the PWM clock signal SP. The calculating unit 212 obtains the corresponding duty cycle according to the absolute difference |Vs−Vf| between the digital sampling value Vs and the reference voltage level Vf, and determines the level of the PWM clock signal SP according to the comparison between the digital sampling value Vs and the reference voltage level Vf.

As mentioned above, the D-class audio power amplifier 200 can be used in an LCD TV whose micro-processor 210 is a power-saving CPU when the LCD TV is operating under power-saving mode. The micro-processor 210 can be the above-disclosed 8051 processor for instance. When the LCD TV is at normal operating state, the 8051 processor, which is originally at idle state, can be used as the micro-processor 210 of the D-class audio power amplifier 200 to receive the input audio signal Sa and provide the PWM clock signal SP without using any extra micro-processors. Consequently, system manufacturing costs are effectively reduced. Furthermore, the operating voltages Vcc and VDD of the power amplifier 220 are directly provided by the system voltages (5V and 12V for instance) of the LCD TV, thus saving the cost of disposing a charge pump in the power amplifier according to prior arts. Moreover, the analog/digital converter 212 samples the input audio signal Sa at a frequency lager than 100 kHz, lest the output audio signal might be distorted.

Figure 3A:
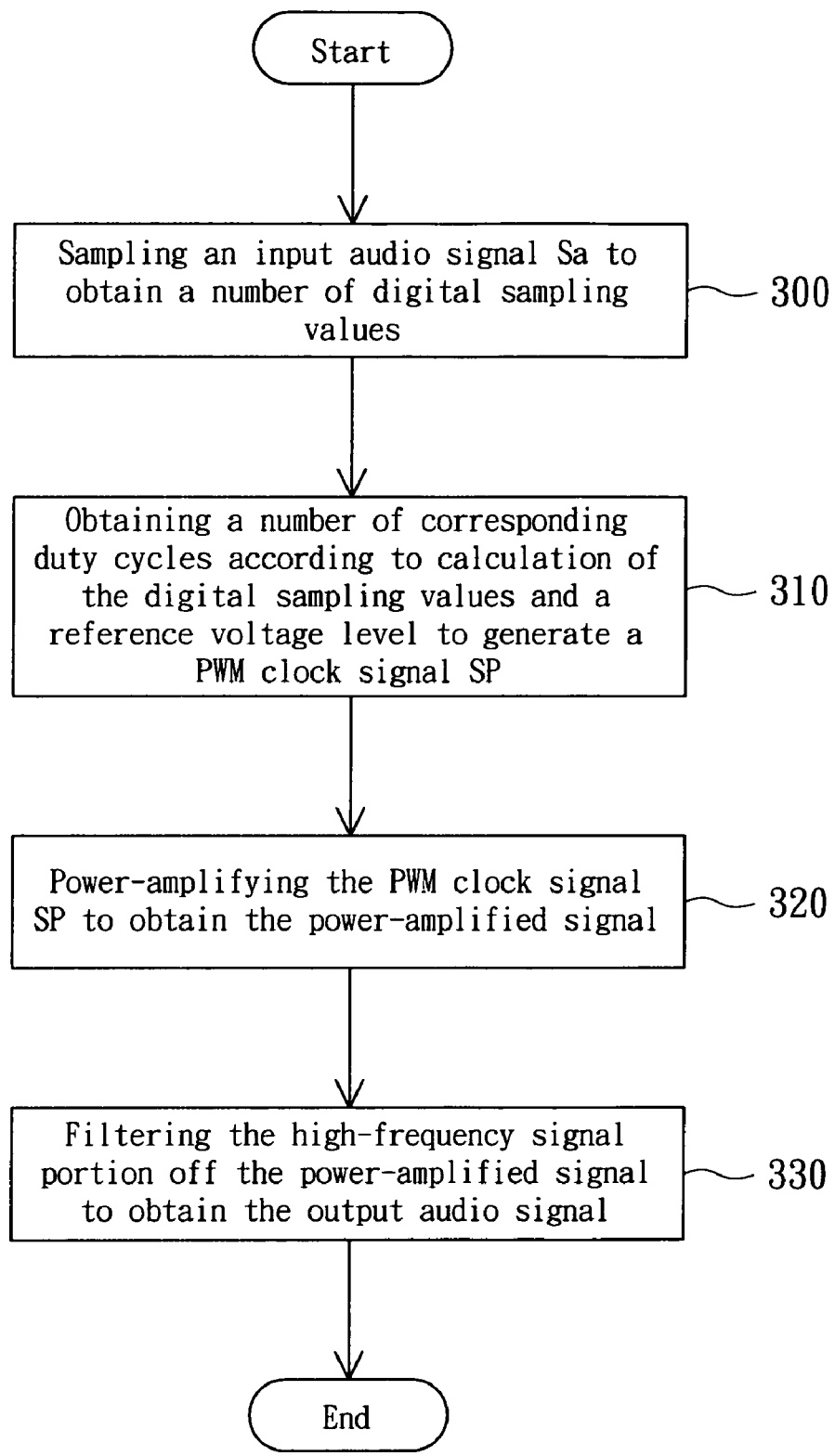
FIG. 3A is a flowchart of a D-class audio-frequency power-amplifying method according to a preferred embodiment of the invention.
Figures 3B, 4:
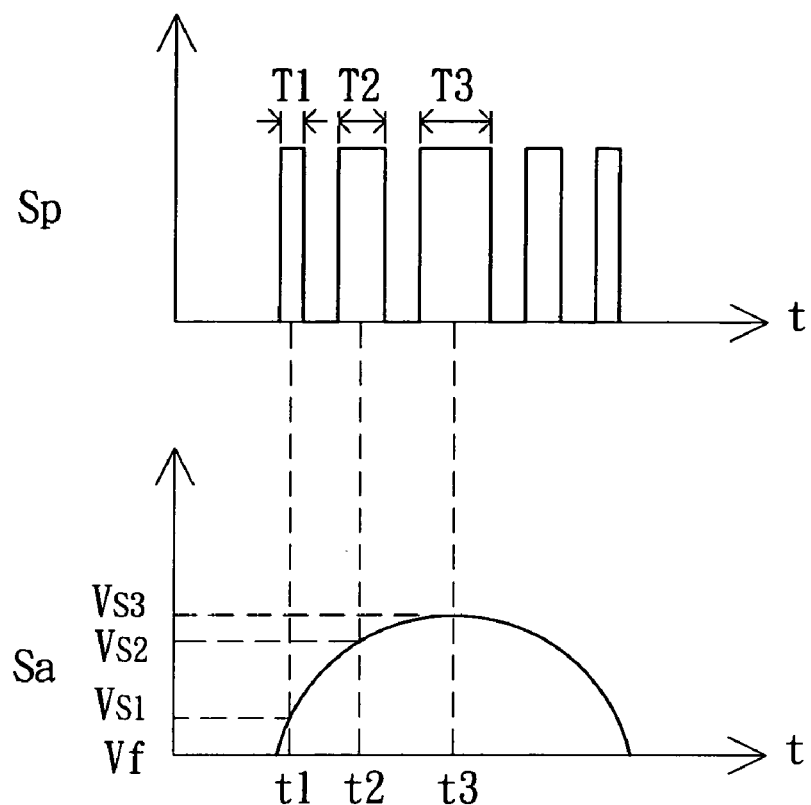
FIG. 3B is a signal time-sequence diagram of sampling the input audio signal to obtain a corresponding PWM clock signal duty cycle value according to FIG. 3A.
FIG. 4 is a parameter reference table set by a firmware according to a D-class audio-frequency power-amplifying method of a preferred embodiment of the invention.

Referring to FIG. 3A, a flowchart of a method for power-amplifying a D-class audio signal according to a preferred embodiment of the invention is shown. Firstly, the method begins at step 300, an input audio signal Sa is sampled to obtain a number of digital sampling values Vs. The above-mentioned analog/digital converter 212 is used to sample the input audio signal Sa at a sampling frequency lager than 100 kHz. Next, proceed to step 310, a number of corresponding duty cycles Dc are obtained according to calculation of the digital sampling values Vs and a reference voltage level Vf to generate a PWM clock signal SP. The corresponding duty cycles Dc are obtained according to the absolute differences |Vs−Vf| between the digital sampling values Vs and the reference voltage level Vf. The larger the value |Vs−Vf| is, the larger the duty cycle Dc will be. As shown in FIG. 3B, the digital sampling values Vs obtained during time points t1, t2 and t3 are respectively equal to Vs1, Vs2 and Vs3, wherein Vs1<Vs2<Vs3. The corresponding duty cycles of the PWM clock signal SP respectively are T1, T2 and T3, wherein T1<T2<T3. The above-mentioned micro-processor 210 can pre-set a parameter reference table via firmware as shown in FIG. 4. The parameter reference table includes a column of sampling comparison values Vc and a column of corresponding duty cycles Vdc. Appropriate corresponding duty cycles Vdc are calculated according to the absolute differences |Vs−Vf| between the digital sampling values Vs and the reference voltage level Vf with reference to the sampling comparison value Vc of the parameter reference table.

Besides, the level of PWM clock signal SP is determined according to the comparison between digital sampling values Vs and the reference voltage level Vf. The clock signal SP is at high level when the digital sampling value Vs is lager than the reference voltage level Vf and is at low level when the digital sampling value Vs is smaller than reference voltage level Vf. Then, proceed to step 320, the PWM clock signal SP is power-amplified to obtain the power-amplified signal SPA. Lastly, the method ends at step 330, the high-frequency signal portion of the power-amplified signal SPA is filtered off so that the output audio signal So is obtained.

The D-class audio power amplifier according to the above-mentioned preferred embodiment of the invention has the advantages of wisely using the idled CPU to drive the D-class audio power amplifier to power-amplify the input audio signal when the LCD TV is under normal operation, thus saving the pulse-wave generator and modulator that would otherwise be needed in prior arts. Moreover, to directly provide the two operating voltages of the power amplifier in the D-class audio power amplifier by the system voltages can effectively reduce system manufacturing costs.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A D-class audio power amplifier, for amplifying an input audio signal and outputting an output audio signal, comprising:
    a micro-processor, including
        an analog/digital converter for sampling the input audio signal and outputting a plurality of digital sampling values, and
        a calculating unit for calculating a plurality of corresponding duty cycles according to calculation of the digital sampling values and a reference voltage level and outputting a pulse width modulation (PWM) clock signal accordingly;
    a power amplifier for power-amplifying the PWM clock signal to obtain a power-amplified signal;
    a low-pass filter for filtering out a high-frequency signal portion of the power-amplified signal and outputting the output audio signal; and
    wherein the calculating unit calculates the corresponding duty cycles according to the absolute difference between the digital sampling values and the reference voltage level.

2. The D-class audio power amplifier according to claim 1, wherein the calculating unit determines the level of the PWM clock signal by comparing the digital sampling values and the reference voltage level.

3. The D-class audio power amplifier according to claim 1, wherein the micro-processor pre-sets a parameter reference table via firmware and the parameter reference table comprises a column of sampling comparison values and a column of corresponding duty cycles.

4. The D-class audio power amplifier according to claim 3, wherein the calculating unit calculates the absolute differences between the digital sampling values and the reference voltage level and obtain appropriate corresponding duty cycles with reference to the column of sampling comparison values of the parameter reference table.

5. The D-class audio power amplifier according to claim 1, wherein the D-class audio power amplifier is adapted for use in an LCD device, while the micro-processor is a power-saving CPU operated when the LCD device is in a power-saving mode.

6. The D-class audio power amplifier according to claim 5, wherein the power amplifier has a first operating voltage and a second operating voltage, provided by system voltages of the LCD device.

7. The D-class audio power amplifier according to claim 5, wherein the LCD device is an LCD TV, while the power-saving CPU is an 8051 processor.

8. The D-class audio power amplifier according to claim 1, wherein the sampling frequency of the analog/digital converter is larger than 100 kHz.

9. A method of power-amplifying a D-class audio signal, for amplifying an input audio signal to obtain an output audio signal, the method comprising:
    sampling the input audio signal to obtain a plurality of digital sampling values;
    calculating a plurality of corresponding duty cycles according to the digital sampling values and a reference voltage level and accordingly generating a PWM clock signal;
    power-amplifying the PWM clock signal to obtain a power-amplified signal;
    filtering out the high-frequency signal portion of the power-amplified signal to obtain the output audio signal; and
    wherein the step of generating the PWM clock signal comprises:
        obtaining the corresponding duty cycle values according to the absolute differences between the digital sampling values and the reference voltage level; and
        determining the level of the PWM clock signal by comparing the digital sampling values and the reference voltage level.

10. The method according to claim 9, using an analog/digital converter to sample the input audio signal.

11. The method according to claim 9, pre-setting a parameter reference table via firmware, wherein the parameter reference table comprises a column of sampling comparison values and a column of corresponding duty cycles.

12. The method according to claim 11, wherein the step of obtaining the corresponding duty cycles comprises calculating the absolute differences between the digital sampling values and the reference voltage level and obtaining appropriate corresponding duty cycles with reference to the column of sampling comparison values of the parameter reference table.

13. The method according to claim 9, wherein the frequency of sampling the input audio signal is larger than 100 kHz.

* * * * *